(12) United States Patent
Seedher et al.

(10) Patent No.: US 7,777,655 B2
(45) Date of Patent: Aug. 17, 2010

(54) WIDEBAND SWITCHED CURRENT SOURCE

(75) Inventors: Ankit Seedher, Bangalore (IN);
 Preetam Charan Anand Tadeparthy,
 Bangalore (IN); Jomy G Joy, Bangalore
 (IN)

(73) Assignee: Texas Instruments Incorporated,
 Dallas, TX (US)

( * ) Notice: Subject to any disclaimer, the term of this
 patent is extended or adjusted under 35
 U.S.C. 154(b) by 0 days.

(21) Appl. No.: 12/257,389

(22) Filed: Oct. 23, 2008

(65) Prior Publication Data

US 2010/0102870 A1 Apr. 29, 2010

(51) Int. Cl.
 *H03M 1/00* (2006.01)
(52) U.S. Cl. .................................. 341/136; 341/144
(58) Field of Classification Search ................ 341/136,
 341/144, 154, 153
 See application file for complete search history.

(56) References Cited

U.S. PATENT DOCUMENTS 6,340,939 B1 * 1/2002 Dedic .................... 341/136
6,621,438 B1 * 9/2003 Hong .................... 341/144

OTHER PUBLICATIONS

Anne Van Den Bosch, Michel S. J. Steyaert and Willy Sansen, "A 10-Bit 1-Gsample/S Nyquist Current-Steering CMOS D/A Converter", vol. 36, No. 3, IEEE, Dated: Mar. 3, 2001, pp. 321 to 324.
Miquel Albiol, José Luis González and Eduard Alarcón, "Mismatch And Dynamic Modeling Of Current Sources In Current-Steering CMOS D/A Converters: An Extended Design Procedure", vol. 51, No. 1, Dated: Jan. 2004, IEEE, pp. 159 to 169.

* cited by examiner

*Primary Examiner*—Jean B Jeanglaude
(74) *Attorney, Agent, or Firm*—John J. Patti; Wade J. Brady, III; Frederick J. Telecky, Jr.

(57) ABSTRACT

Traditionally, constant current source circuits (and, in particular, constant current source circuits that include cascoded current sources) had numerous drawbacks due to parasitic capacitances, especially at higher switching frequencies. Here, however, a constant current source circuit is provided which uses main and replica constant current source circuitry (with buffering therebetween) to counteract the problems created by parasitic capacitances. Thus, with these new circuits, a generally constant current can be generated, regardless of switching frequency.

13 Claims, 4 Drawing Sheets

WIDEBAND SWITCHED CURRENT SOURCE

BACKGROUND

1. Field of the Invention

The present invention relates generally to current sources, and more specifically to providing such current source in environments such as analog to digital converters (ADC) and digital to analog converters (DAC), which may require the current source to be switched on and off at high frequencies.

2. Related Art

A current source refers to a component which provides a substantially constant current independent of the load offered to it. There are several situations in which it is desirable to switch on and off providing such constant current. For example, in high speed DACs, current sources may be used to control the strength of the output signal and the current may need to be accordingly switched on and off at a correspondingly high frequency. Such current sources operable to be switched at high frequency are termed as wideband switched current sources.

One general requirement in such situations is that the magnitude of current be maintained at the same level even when switched at high frequencies. For example, in the context of DACs, such a feature enables a DAC to provide a linear response (i.e., the magnitude of current output is linearly proportionate to the input digital value provided to the DAC).

SUMMARY

A current source block provided according to an aspect of the present invention provides a substantially constant current even when the provision of the current is switched on and off at different frequencies. In an embodiment, the current source block contains a first current source element to generate a first constant current at a first node, and a second current source element to generate a second constant current at a second node.

The current source block may further contain four switches. The first switch may be operable to be turned on when a control signal is at a first logic level and to be turned off when the control signal is at a second logic level, with the first switch coupling the first constant current to a first terminal when turned on and disconnecting the first constant current from the first terminal when off.

The second switch may be operable to be turned off when the control signal is at the first logic level and to be turned on when the control signal is at the second logic level, with the second switch coupling the first constant current to a second terminal when turned on and disconnecting the first constant current from the second terminal when off.

The third switch may be operable to be turned on when the control signal is at the first logic level and to be turned off when the control signal is at the second logic level, with the third switch coupling the second constant current to a third terminal when turned on and disconnecting the second constant current from the third terminal when off.

The fourth switch operable to be turned off when the control signal is at the first logic level and to be turned on when the control signal is at the second logic level, with the fourth switch coupling the second constant current to a fourth terminal when turned on and disconnecting the second constant current from the fourth terminal when off.

In addition, the first terminal is coupled to the fourth terminal, and the second terminal is coupled to the third terminal. Also, the first node is coupled to the second node. As a result, the current source block provides a constant current even when switched off/on at different (in particular high) frequencies.

Such current source blocks may be used in components such as current steering DACs to obtain a linear response even at high operational frequencies.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF EXAMPLE EMBODIMENTS

1. Example Environment

Figure 1:
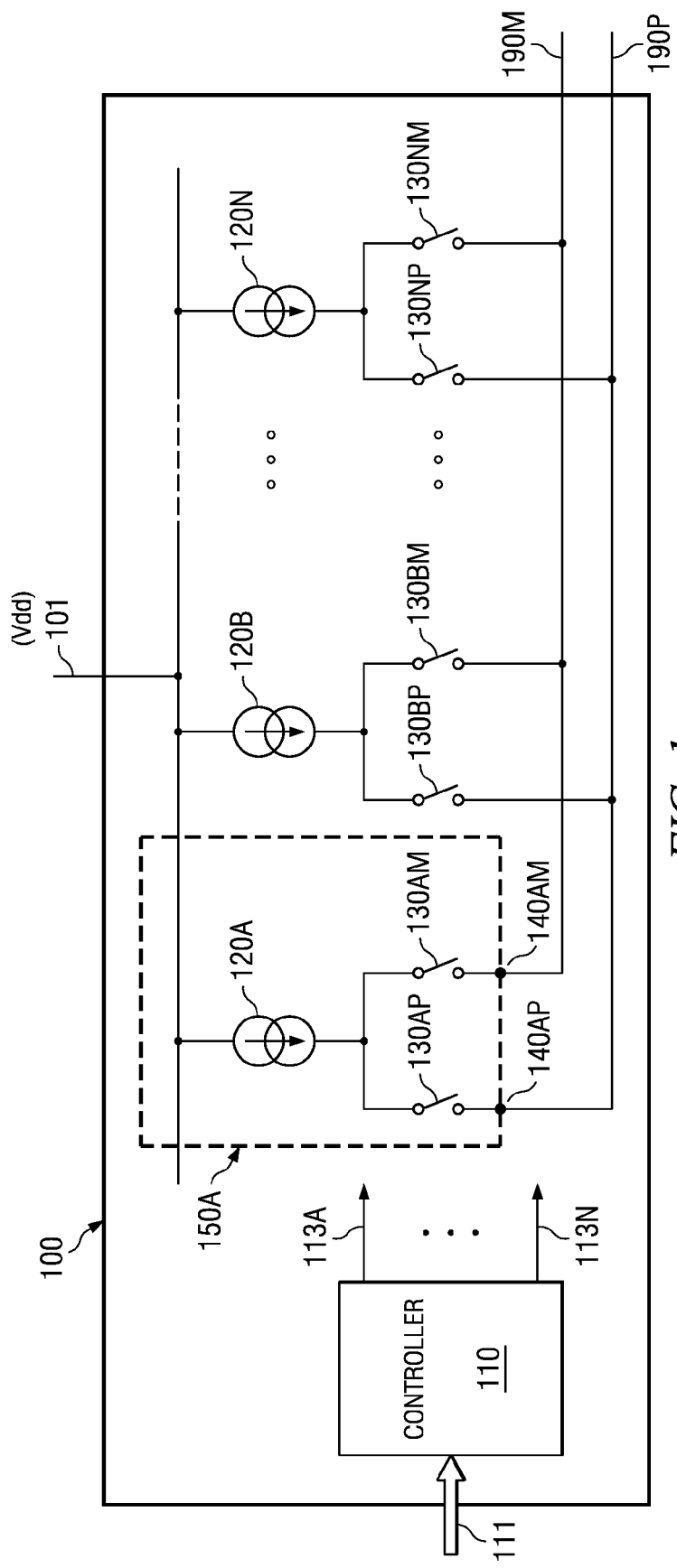
FIG. 1 is a block diagram illustrating the details of an example environment in which several aspects of the present invention can be implemented.

FIG. 1 is a block diagram illustrating the details of an example environment in which several aspects of the present invention can be implemented. The diagram shows current steering DAC 100 containing controller 110, current sources 120A-120N, and switches 130AP through 130NP, and 130AM through 130NM.

Each of current sources 120A-120N provides a constant current. In the example of FIG. 1, it is assumed that each current source 120A-120N provides a same constant current (of value I). The number (N) of current sources generally depends on the specific implementation of DAC 100. For example, if DAC 100 is implemented as a binary DAC, then N equals the width (number of bits) of the digital value received on path 111. If DAC 100 is implemented as a thermometric DAC, N equals [2^Z], (2 to the power of Z, Z being the number of bits in digital value 111). Path 101 represents a power supply bus (Vdd), and is connected to all the current sources, as shown in FIG. 1. Vdd may be provided to DAC 100 from an external source.

A pair of switches is associated with each current source, with one switch coupling the current to path 190M and the other to path 190P. During conversion of a digital code to corresponding analog signal, the current of each current source may be coupled to path 190M or 190P or neither, depending on the strength of the current desired on each of the paths.

Controller 110 receives a digital value on path 111, and generates control signals on respective paths 113A-113N to close or open corresponding switches 130AP through 130NM, and 130AM through 130NM, to generate a current signal in differential form on paths 190P and 190M, representing an analog signal proportionate to the received digital value 111. For example, assuming a thermometric DAC implementation, if a current of strength 2 units is desired, 2 more current sources may be coupled to path 190M compared to those coupled to 190P.

Various other approaches to implementing the current sources and corresponding controller can be used, as will be apparent to a skilled practitioner. Further, although not shown in the Figure, the (differential) current output on paths 190P and 190M may be converted to a voltage output using operational amplifiers, load resistors, etc., as is also well known in the relevant arts.

The internal operation of DAC 100, including opening and/or closing of the switches shown, may be performed with respect to a clock signal (not shown). The combination of a current source and corresponding switches is referred to below as a current source block, for ease of description. Thus, the combination of current source 120A, and switches 130AP and 130AM may be referred to as current source block 150A, with output terminals 140AP and 140AM respectively connected to differential outputs 190P and 190M, when implemented as a block in DAC 100.

Various features of the present invention enable the current source block to provide constant current substantially immune to various undesirable effects at different switching frequencies. The features will be clearer in comparison to a prior approach and accordingly the details of a prior implementation of a current source block are briefly described next.

2. Prior Current Source Block

Figure 2:
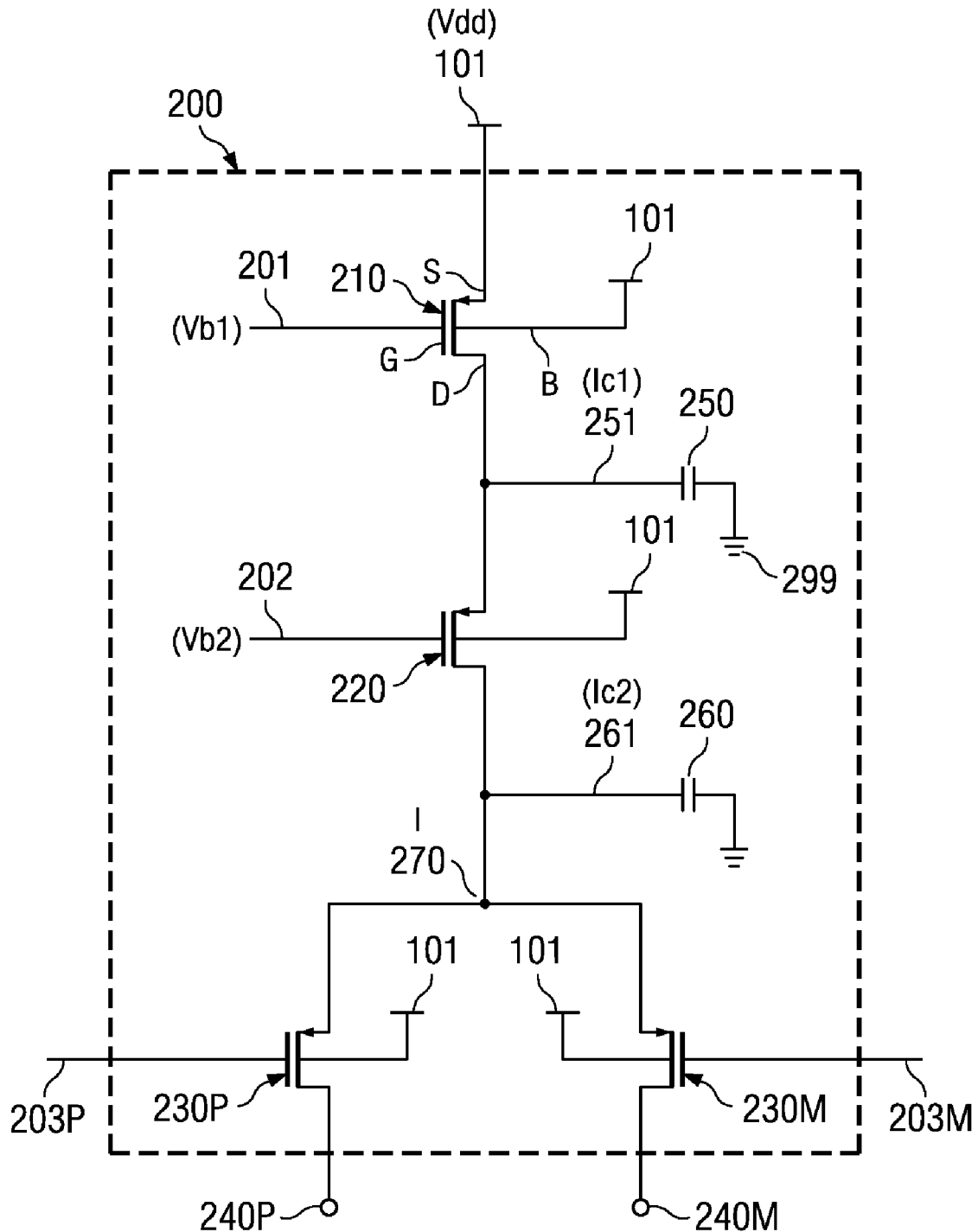
FIG. 2 is a diagram illustrating the details of a prior current source block.

FIG. 2 is a diagram illustrating the implementation details of a prior current source block. Prior current source block 200, which may be used in place current source block 150A (or any of the other current source blocks in FIG. 1), is shown containing PMOS transistors 210, 220, 230P and 230M. The gate, source, drain and bulk terminals of transistor 210 are denoted respectively by symbols G, S, D and B. Corresponding terminals of the other transistors have similar meanings. The bulk (substrate) terminal of each of each of the transistors is shown connected to power supply (Vdd) 101. Terminal 299 represents ground (or any other constant potential terminal).

Transistors 210 and 220 are shown connected in a cascode arrangement, with bias voltages 201 (Vb1) and 202 (Vb2) being respectively applied to the gate terminals of the transistors. The cascode arrangement of transistors 210 and 220 operates as a constant current source (providing a constant current of magnitude "I" at node 270) with high output impedance, as is well known in the relevant arts. Transistors 230P and 230M operate as switches, and are controlled to be open or closed by complementary control signals 203P and 203M provided to their respective gate terminals. When transistor 230P is ON (with transistor 230M being concurrently OFF), the constant current "I" provided by the cascoded transistors 210 and 220 flows into node 240P. When transistor 230P is OFF (with transistor 230M being concurrently ON), the constant current "I" provided by the cascoded transistors 210 and 220 flows into node 240M.

Capacitors 250 and 260 represent parasitic capacitances that are formed inherently in the manufacturing process of current source block 200, and connect the drain terminals of transistors 210 and 220 to ground terminal (or some constant reference potential). Various other parasitic elements (including capacitors) may be present between other terminals of the transistors, or between one or more terminals and power supply/ground (constant potential terminals), but are not shown in FIG. 2. Prior current source block 200 may have several drawbacks, as described next.

Firstly, the output impedance of the cascode current source (formed by transistors 210 and 220) decreases as the operating frequency increases (with corresponding higher rates of switching, i.e., opening and closing of switch transistors 230P and 230M), due to presence of parasitic capacitors 250 and 260. Denoting capacitances of capacitors 250 and 260 respectively as $C_1$ and $C_2$, voltages at nodes 251 and 270 as $V_1$ and $V_2$ respectively, and the operating (switching_ frequency as "f", the currents Ic1 (path 251) and Ic2 (path 261) are respectively equal to $V_1 2\pi f C_1$ and $V_2 2\pi f C_2$. Thus, as the value of "f" increases, current Ic1 and Ic2 increase, thereby reducing the value of the desired constant current output "I".

Secondly, the capacitances $C_1$ and $C_2$ are not constant values, but dependent on the voltages $V_1$ and $V_2$. Consequently, the capacitive currents Ic1 and Ic2 are in turn dependent on voltages $V_1$ and $V_2$, and therefore vary as voltages $V_1$ and $V_2$ vary. Thus, Ic1 and Ic2 may be expressed by the following equations:

$$Ic1 = V_1 2\pi f [fn1(V_1)] \qquad \text{Equation 1}$$

$$Ic2 = V_2 2\pi f [fn2(V_2)] \qquad \text{Equation 2}$$

wherein, fn1 and fn2 represent a 'function of' operation.

It may be appreciated that voltages $V_1$ and $V_2$ vary as the voltage on terminals 240P and 240M, the variations being attenuated versions of the variations of the respective voltages on terminals 240P and 240M. When used in DAC 100 (FIG. 1), terminals 240P and 240M are connected to differential output terminals 190P and 190M respectively. During operation of DAC 100, the voltages on differential output terminals 190P and 190M may vary. As a result, voltages $V_1$ and $V_2$ vary, in turn causing currents Ic1 and Ic2 to vary in a non-linear fashion. The desired 'constant' current "I" thus varies in a non-linear fashion, with the degree of non-linearity generally increasing as the operating frequency increases.

Another drawback of prior current source block 200 is that the presence of capacitor 260 may result in the capacitors maintaining (at least partially) the memory of previous transitions at the common source node (270) of prior current source block (cell) 200. Such 'retention of memory' of past transitions may occur since the charge stored previously (in one or more previous clock cycles when operated as part of a DAC) in capacitor 260 may not be completely discharged. Again, such an effect may cause the desired constant current output of current source block 200 to be different from "I".

It may be appreciated from description above that when prior current source block 200 is required to be switched ON and OFF at high frequencies, the desired constant current value may deviate (in the corresponding switching intervals) from the ideal value "I". When implemented for use in a component such as current steering DAC 100, such deviations may result in degradation in the linearity (a measure of how linearly proportionate the analog output values of the DAC are to the corresponding input digital values) as the operating frequency increases, and may pose a limitation to the best achievable high frequency dynamic performance of the DAC.

Some prior solutions to the drawbacks noted above attempt to overcome the drawbacks by adjusting (during the design phase) the sizes of the transistors used to implement the current sources (for lower parasitic capacitances), and/or adjusting the magnitudes of currents provided by the current sources to achieve wider bandwidth. However, such approaches may entail higher cost (for example, due to less than optimal current source sizes), poorer static (DC and low frequency performance), higher power consumption etc, and may not be desirable. Further, fabrication processes may limit the improvement in performance that may be obtainable using the above noted approaches.

Several aspects of the present invention overcome one or more of the drawbacks noted above, and are described next with respect to example embodiment(s).

3. Wideband Current Source

Figure 3:
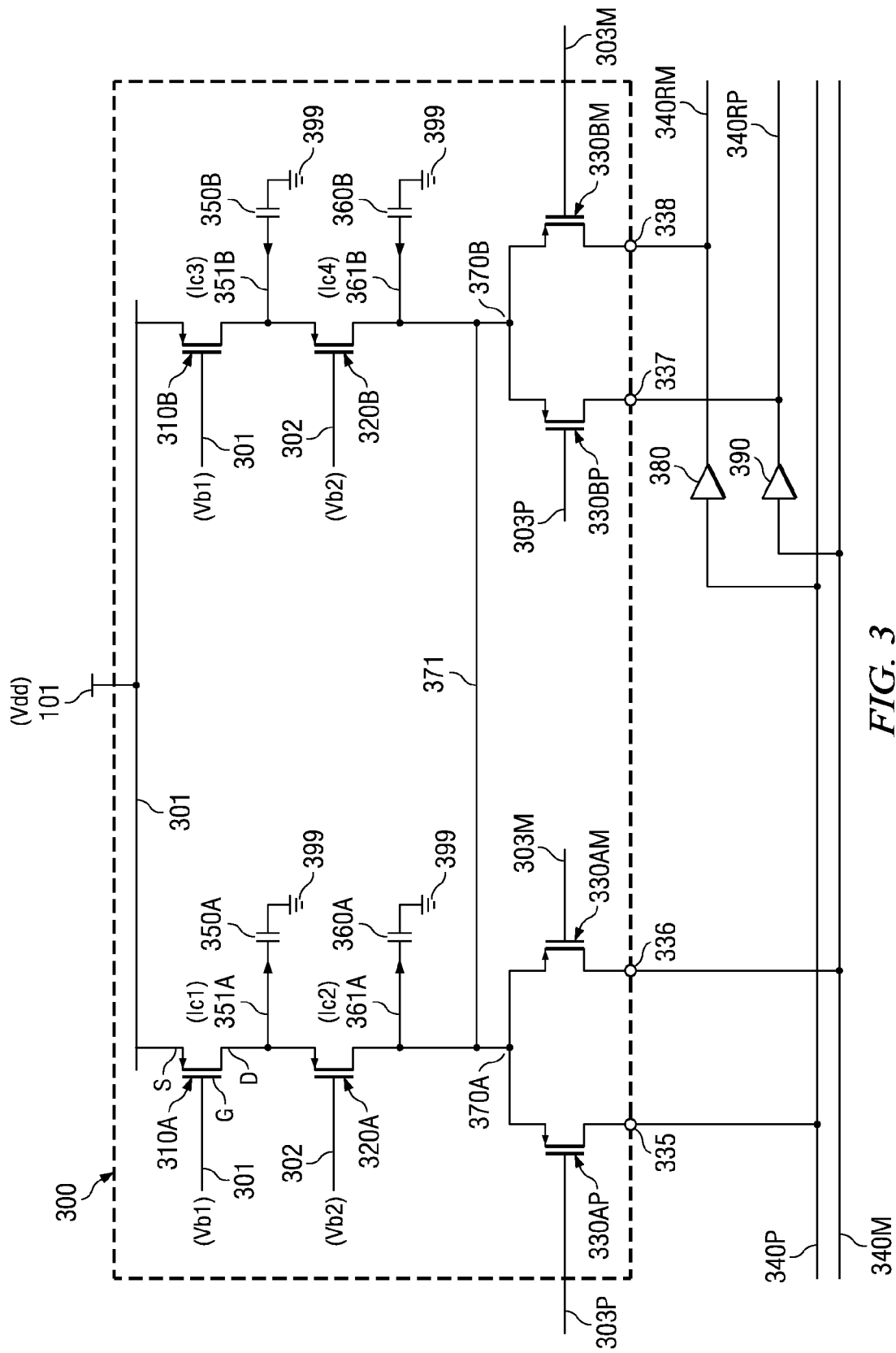
FIG. 3 is a diagram illustrating the details of a current source block in an embodiment of the present invention.

FIG. 3 is circuit diagram illustrating the implementation details of a current source block in an embodiment of the present invention. Current source block 300 is shown containing PMOS transistors 310A, 320A, 330AP, 330AM, 310B, 320B, 330BP, 330BM. The diagram also shows buffers 380 and 390. The gate, source, and drain terminals of transistor 310A are denoted respectively by symbols G, S, and D. Corresponding terminals of the other transistors have similar meanings. The bulk (substrate) terminal of each of the transistors of FIG. 3 is assumed to be connected to power supply (Vdd) 101, and not shown. Terminal 399 represents ground (or any other constant potential terminal). Capacitors 350A, 360A, 350B and 360B represent parasitic capacitances, similar to those noted above with respect to the circuit of FIG. 2.

Circuit portion formed by PMOS transistors 310B, 320B, 330BP and 330BM may be viewed as a replica of portion formed by PMOS transistors 310A, 320A, 330AP and 330AM, and is referred to below conveniently as "replica portion". In the description below, the portion formed by PMOS transistors 310A, 320A, 330AP and 330AM is referred to as the "main portion". Thus, a replica portion has the same number of transistors as a main portion and coupled in identical configuration as well. The output nodes of the main portion are denoted in FIG. 3 by numerals 335 and 336, and (when used in a DAC) are connected to the differential outputs 340P and 340M of the DAC. The output nodes of the replica portion are denoted by numerals 337 and 338.

Each of the portions (main and replica) individually operates similar to current source block 200 of FIG. 2, and their detailed operation is not repeated here in the interest of conciseness. Control signal 303P is provided to the gate terminals of transistors 330AP and 330BP, while control signal 303M (which is the inverted version of, and hence complementary to control signal 303P) is provided to the gate terminals of transistors 330AM and 330BM, to open (switch ON) or close (switch OFF) the corresponding transistors. When used in a current steering DAC, such as DAC 100 (FIG. 1), control signals 303P and 303M may be provided by controller 110 (FIG. 1), and differential output paths 340P and 340M correspond to paths 190P and 190M respectively.

As noted with respect to the prior circuit of FIG. 2, as the operating frequencies (signal frequencies of the analog output on path 190P/190M) increase, the switching frequencies of switch transistors 330AP and 330AM increase correspondingly (the switching frequencies being at least two times the signal frequency of the analog signal), and capacitive currents through parasitic capacitors 350A and 360A cause a deviation in the current "I" provided on (one of) differential outputs 340P and 340M by the current source formed by the cascode combination of transistors 310A and 320A.

Assuming, for example, that currents Ic1 and Ic2 are the respective currents through capacitors 350A and 360A (paths 351A and 361A respectively, in the Figure), the current provided on a differential output path (340P or 340M) may equal (I−Ic1−Ic2).

Outputs on paths 335 and 336 are buffered respectively by buffers 380 and 390, and the buffered outputs are provided on "buffered" paths 340RM and 340RP respectively. Output nodes 337 and 338 of the "replica" portion formed by PMOS transistors 310B, 320B, 330BP and 330BM are connected to respective buffered paths 340RP and 340RM. Each of buffers 380 and 390 may be implemented as unity gain buffers with low output impedance, for example, using well known circuits such as a source follower or a unity gain feedback amplifier.

It may be observed from FIG. 3, that output 335 of the "P" arm formed by switch 330AP of the main portion is provided to the "M" arm formed by switch 330BM of the replica portion. Similarly, output 336 of the "M" arm formed by switch 330AM is provided to the "P" arm formed by switch 330BP of the replica portion. The output current of the replica portion (paths 337 or 338) is not provided on the output nodes 340P and 340M of current source block 300, but is instead sunk or sourced by the corresponding one of buffers 380 and 390. Therefore, the replica portion does not affect the operation of the "main" current source portion (formed by PMOS transistors 310A, 320A, 330AP and 330AM).

For a differential output, the voltages at nodes 335 and 336 are 180 degrees out of phase. Hence, since the "P" and "M" outputs of the two portions (main and replica) are swapped, the voltage change (when outputs 340P and 340M are connected to a load) at node 370B has a magnitude that is equal to and the negative of (i.e., 180 degrees out of phase with) the voltage change at node 370A. As a result, the current drawn by the capacitive loads in the main portion also has the same phase relationship (180 degrees shifted relationship) with the current drawn by the capacitive loads in the replica source, i.e., the current (Ic3+Ic4) equals current (Ic1+Ic2), but flows in the opposite direction. To illustrate, assuming total current (Ic1+Ic2) flows into the corresponding capacitors 350A and 360A (and thence to ground), total current (Ic3+Ic4) flows into node 370B via capacitors.

Since nodes 370A and 370B are shorted, current (Ic3+Ic4) replenishes the current (Ic1+Ic2) lost (subtracted from ideal current output "I"), by flowing through connecting path 371. As a result, the current provided by "main" portion is maintained at the constant (and ideal) value of "I".

Current source block 300 (formed by the combination of the "main" and "replica" portions as described above), thus operates substantially as an ideal current source, and provides a substantially constant output current "I" even when switched (operated) at high frequencies. It is noted that the technique described above also increases the static impedance (impedance at DC or low frequencies) of a current source leading to better non-linearity performance at lower frequencies as well.

Further, it may be appreciated that capacitors 350A and 360B are maintained in a "reset" state before a next switching occurs, since any (prior) stored charge on these capacitors is neutralized by the current provided by the replica portion. Thus, no effective dynamic current is drawn from capacitors 350A and 360A. As a result, "memory of previous transitions" due to charge storage in capacitors 350A and 360A is also eliminated or substantially reduced.

When employed in a component such as current steering DAC 100 (FIG. 1), current source block 300 enables minimization of degradation in linearity of the DAC at high operational frequencies. Therefore, a DAC employing current source blocks such as current source block 300 may be enabled to have an almost flat linearity performance across a wide frequency range, and a low total harmonic distortion (THD).

Figure 4:
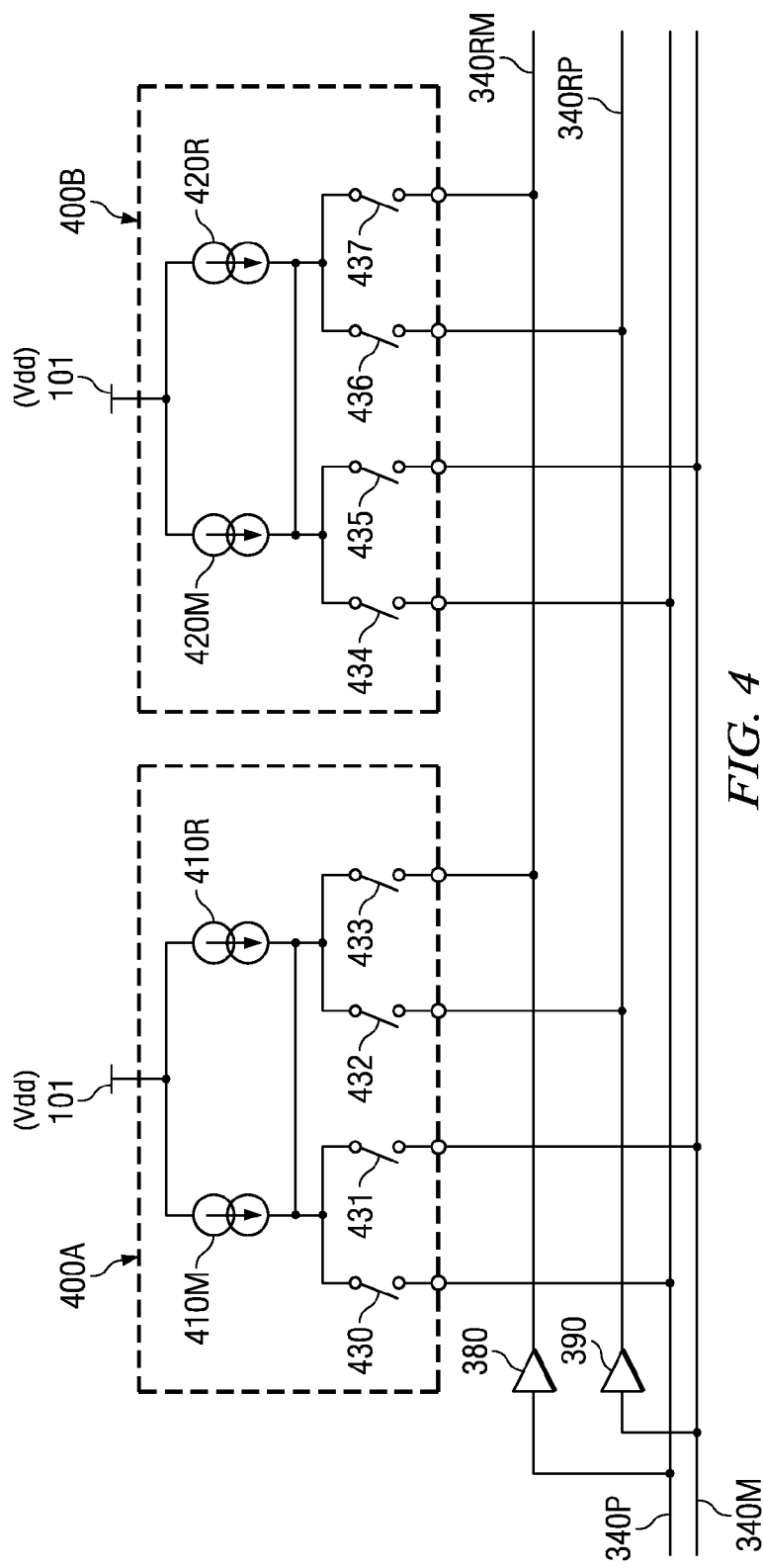
FIG. 4 is a diagram illustrating the manner in which a single pair of buffers can be used for multiple current source blocks, in an embodiment of the present invention.

In an embodiment of the present invention illustrated with respect to FIG. 4, only one set of buffers (380 and 390) is used for an entire DAC that may use multiple current source blocks. In FIG. 4, two current source blocks, 400A and 400B, are shown, with each of the current source blocks being identical to current source block 300 of FIG. 3. Switches 430, 431, 432 and 433 correspond respectively to switch transistors 330AP, 330AM, 330BP and 330BM of FIG. 3, and are operable to be on or off based on the logic value of an input bit of a DAC. Switches 434, 435, 435 and 437 are operable based on the logic value of another bit of the DAC. Current source 410R corresponds to the current source combination of transistors 310B and 320B. Current source 410M corresponds to the current source combination of transistors 310A and 320A of FIG. 3. Current sources 420M and 420R are identical to current sources 410M and 410R. Although only two current source blocks are shown, more current source blocks may be connected in a similar fashion.

Referring again to FIG. 3, various other techniques using the basic structure of FIG. 3 may be employed depending on the degree of performance that is desired. For example, instead of shorting nodes 370A and 370B, paths (nodes) 351A and 351B may instead be shorted. Such a variant technique ensures that the capacitances degradation in performance due to capacitance 350A is eliminated or minimized, with performance degradation being limited to that caused by capacitance 360A alone.

In yet another variation of the techniques described above, the shorting of nodes 370A and 370B (described with respect to FIG. 3) is performed only during a first half of a clock cycle. This ensures that there is no memory of previous transitions in the current source but the undesirable effect of current source impedance may be present for the later half of each clock cycle.

It is noted that buffers 380 and 390 provide minimal or (ideally) zero phase shift to respective input signals on paths 335 and 336. Thus, in an embodiment of the present invention, buffers 380 and 390 are implemented to have a bandwidth sufficiently higher than the bandwidth (range of frequencies) of operation.

It is further noted that any mismatch (for example, resistance) among switches 330AP, 330AM, 330BP and 330BM may result in an "error current" flowing through path 371 to have a component proportional to such "switch mismatch", in addition to the capacitive error current described above. In such scenarios, well known techniques to compensate for such mismatches (such as, for example, dynamic-element-matching (DEM)) may be employed on the composite 'super' current source cell since the mismatch of the switches shall also be shaped in addition to the current source mismatch. Another technique to overcome such mismatch is to implement a return-to-zero output DAC in conjunction with shorting nodes 370A and 370B only for half of every clock period.

An example system/device incorporating several features of the present invention as noted above is illustrated next with respect to FIG. 5.

4. System/Device

Figure 5:
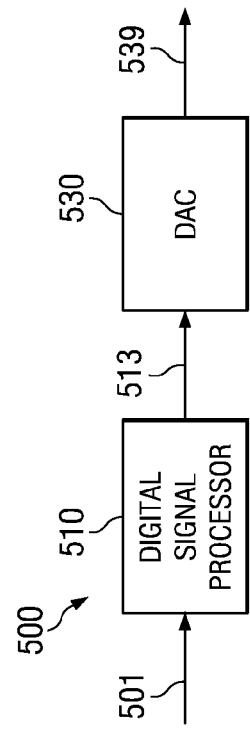
FIG. 5 is a block diagram of an example system/device incorporating several aspects of the present invention.

FIG. 5 is a block diagram of a system/device incorporating several features of the present invention. System 500 is shown containing digital signal processor (DSP) 510, and DAC 530. DSP 510 may perform various signal processing operations on a signal (assumed to be converted from analog to digital from) provided on path 510. Some example processing operations include filtering, signal shaping, extracting information content from the received signal, etc.

DSP 510 provides digital values representing a desired output signal (for example, a filtered signal) on path 513 to DAC 530. DAC 530 operates to convert the digital values received on path 513 to corresponding analog levels, and provides an analog output on path 539 DAC 530 may be implemented using current source blocks similar to current source block 300 (FIG. 3) (and connected in the manner shown in FIG. 4) to provide analog output 539 with improved linearity, and minimal THD.

It should be appreciated that the specific type of transistors (PMOS, etc.) noted above are merely by way of illustration. However, alternative embodiments using different configurations and transistors will be apparent to one skilled in the relevant arts by reading the disclosure provided herein. For example, the PMOS transistors may be replaced with NMOS (N-type MOS) transistors, while also interchanging the connections to power and ground terminals.

Accordingly, in the instant application, the power and ground terminals are referred to as reference potentials, the source and drain terminals of transistors (though which a current path is provided when turned on and an open path is provided when turned off) are termed as current terminals, and the gate terminal is termed as a control terminal. Furthermore, though the terminals are shown with direct connections to various other terminals, it should be appreciated that additional components (as suited for the specific environment) may also be present in the path, and accordingly the connections may be viewed as being electrically coupled to the same connected terminals.

In addition, the circuit topology of FIG. 3 is merely representative. Various modifications, as suited for the specific environment, without departing from the scope and spirit of several aspects of the present invention, will be apparent to one skilled in the relevant arts by reading the disclosure provided herein.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:
1. An apparatus comprising:
 a first output terminal;
 a second output terminal;
 a third output terminal;
 a fourth output terminal;
 a first current source;
 a second current source;
 a first switch that is coupled between the first and second current sources and the first and second output terminals, wherein the first switch couples the first and second current sources to the first output terminal in a first state, and wherein the first switch couples the first and second current sources to the second output terminal in a second state;
a second switch that is coupled between the first and second current sources and the third and fourth output terminals, wherein the second switch couples the first and second current sources to the third output terminal in the first state, and wherein the second switch couples the first and second current sources to the fourth output terminal in the second state;
a first buffer having an input and an output, wherein the input of the first buffer is coupled to the first output terminal, and wherein the output of the first buffer is coupled to the fourth output terminal; and
a second buffer having an input and an output, wherein the input of the second buffer is coupled to the second output terminal, and wherein the output of the second buffer is coupled to the third output terminal.

2. The apparatus of claim 1, wherein the first and second current sources further comprises first and second cascoded current sources.

3. The apparatus of claim 2, wherein the first cascoded current source further comprises:
a first PMOS transistor that receives a first bias voltage at its gate, wherein the first PMOS transistor includes a first parasitic capacitance between its drain and ground; and
a second PMOS transistor that receives a second bias voltage at its gate, that is coupled to the drain of the first PMOS transistor at its source, and that is coupled to the first and second switches at its drain, wherein the second PMOS transistor includes a second parasitic capacitance between its drain and ground.

4. The apparatus of claim 3, wherein the second cascoded current source further comprises:
a third PMOS transistor that receives the first bias voltage at its gate, wherein the first PMOS transistor includes a third parasitic capacitance between its drain and ground; and
a fourth PMOS transistor that receives the second bias voltage at its gate, that is coupled to the drain of the third PMOS transistor at its source, and that is coupled to the first and second switches at its drain, wherein the fourth PMOS transistor includes a fourth parasitic capacitance between its drain and ground.

5. The apparatus of claim 4, wherein the first switch further comprises:
a fifth PMOS transistor that receives a control signal at its gate, that is coupled to the first and second cascoded current sources at its source, and that is coupled to the first output terminal at its drain; and
a sixth PMOS transistor that receives an inverse of the control signal at its gate, that is coupled to the first and second cascoded current sources at its source, and that is coupled to the second output terminal at its drain.

6. The apparatus of claim 5, wherein the first switch further comprises:
a seventh PMOS transistor that receives the control signal at its gate, that is coupled to the first and second cascoded current sources at its source, and that is coupled to the third output terminal at its drain; and
a sixth PMOS transistor that receives the inverse of the control signal at its gate, that is coupled to the first and second cascoded current sources at its source, and that is coupled to the fourth output terminal at its drain.

7. An apparatus comprising:
a first output terminal;
a second output terminal;
a third output terminal;
a fourth output terminal;
a controller;
a plurality of constant current source circuits, wherein each constant current source circuits includes:
a first current source;
a second current source;
a first switch that is coupled between the first and second current sources and the first and second output terminals, wherein the first switch is controlled by the controller, and wherein the first switch couples the first and second current sources to the first output terminal in a first state, and wherein the first switch couples the first and second current sources to the second output terminal in a second state; and
a second switch that is coupled between the first and second current sources and the third and fourth output terminals, wherein the second switch is controlled by the controller, and wherein the second switch couples the first and second current sources to the third output terminal in the first state, and wherein the second switch couples the first and second current sources to the fourth output terminal in the second state;
a first buffer having an input and an output, wherein the input of the first buffer is coupled to the first output terminal, and wherein the output of the first buffer is coupled to the fourth output terminal; and
a second buffer having an input and an output, wherein the input of the second buffer is coupled to the second output terminal, and wherein the output of the second buffer is coupled to the third output terminal.

8. The apparatus of claim 7, wherein the first and second current sources further comprises first and second cascoded current sources.

9. The apparatus of claim 8, wherein the first cascoded current source further comprises:
a first PMOS transistor that receives a first bias voltage at its gate, wherein the first PMOS transistor includes a first parasitic capacitance between its drain and ground; and
a second PMOS transistor that receives a second bias voltage at its gate, that is coupled to the drain of the first PMOS transistor at its source, and that is coupled to the first and second switches at its drain, wherein the second PMOS transistor includes a second parasitic capacitance between its drain and ground.

10. The apparatus of claim 9, wherein the second cascoded current source further comprises:
a third PMOS transistor that receives the first bias voltage at its gate, wherein the first PMOS transistor includes a third parasitic capacitance between its drain and ground; and
a fourth PMOS transistor that receives the second bias voltage at its gate, that is coupled to the drain of the third PMOS transistor at its source, and that is coupled to the first and second switches at its drain, wherein the fourth PMOS transistor includes a fourth parasitic capacitance between its drain and ground.

11. The apparatus of claim 10, wherein the controller provides a control signal and an inverse of the control signal to the first and second switches.

12. The apparatus of claim 11, wherein the first switch further comprises:
a fifth PMOS transistor that receives the control signal at its gate, that is coupled to the first and second cascoded current sources at its source, and that is coupled to the first output terminal at its drain; and a sixth PMOS transistor that receives the inverse of the control signal at its gate, that is coupled to the first and second cascoded current sources at its source, and that is coupled to the second output terminal at its drain.

13. The apparatus of claim 12, wherein the first switch further comprises:

a seventh PMOS transistor that receives the control signal at its gate, that is coupled to the first and second cascoded current sources at its source, and that is coupled to the third output terminal at its drain; and a sixth PMOS transistor that receives the inverse of the control signal at its gate, that is coupled to the first and second cascoded current sources at its source, and that is coupled to the fourth output terminal at its drain.

* * * * *